United States Patent
Feng

(10) Patent No.: US 8,053,175 B2
(45) Date of Patent: Nov. 8, 2011

(54) METHOD OF FORMING MEASURING TARGETS FOR MEASURING DIMENSIONS OF SUBSTRATE IN SUBSTRATE MANUFACTURING PROCESS

(75) Inventor: Hsiang-Ming Feng, Tainan County (TW)

(73) Assignee: ASE Electroncis Inc., Kaohsiung (TW)

( * ) Notice: Subject to any disclaimer, the term of this patent is extended or adjusted under 35 U.S.C. 154(b) by 750 days.

(21) Appl. No.: 12/136,292

(22) Filed: Jun. 10, 2008

(65) Prior Publication Data

US 2009/0258320 A1    Oct. 15, 2009

(30) Foreign Application Priority Data

Apr. 10, 2008  (TW) ............................... 97113049 A

(51) Int. Cl.
*G03F 7/20* (2006.01)
(52) U.S. Cl. ....................................................... 430/315
(58) Field of Classification Search .................. 430/311, 430/320, 314, 313, 30, 22
See application file for complete search history.

(56) References Cited

U.S. PATENT DOCUMENTS

| 6,440,641 B1 * | 8/2002 | Lykins et al. ............... 430/315 |
| 2002/0105774 A1 * | 8/2002 | Wermer et al. ............. 361/311 |
| 2006/0073638 A1 * | 4/2006 | Hsu ........................... 438/110 |

* cited by examiner

*Primary Examiner* — Cynthia Kelly
*Assistant Examiner* — Caleen Sullivan
(74) *Attorney, Agent, or Firm* — J.C. Patents

(57) ABSTRACT

A method of forming measuring targets for measuring the dimensions of a substrate during a substrate manufacturing process is provided. First, a board having a base layer and a conductive layer is provided, wherein the conductive layer is disposed on a surface of the base layer. Then, at least one through hole is formed in the board as a measuring target for measuring the dimensions of the substrate. Next, a plated via is formed in the through hole as another measuring target for measuring the dimensions of the substrate. Thereafter, a patterned dielectric layer is formed on the board to expose the plated via as a next measuring target for measuring the dimensions of the substrate. In the present invention, measuring targets are formed during a substrate manufacturing process and the dimensions of the substrate are measured instantly. The accuracy in process alignment is improved without increasing the fabrication cost.

17 Claims, 7 Drawing Sheets

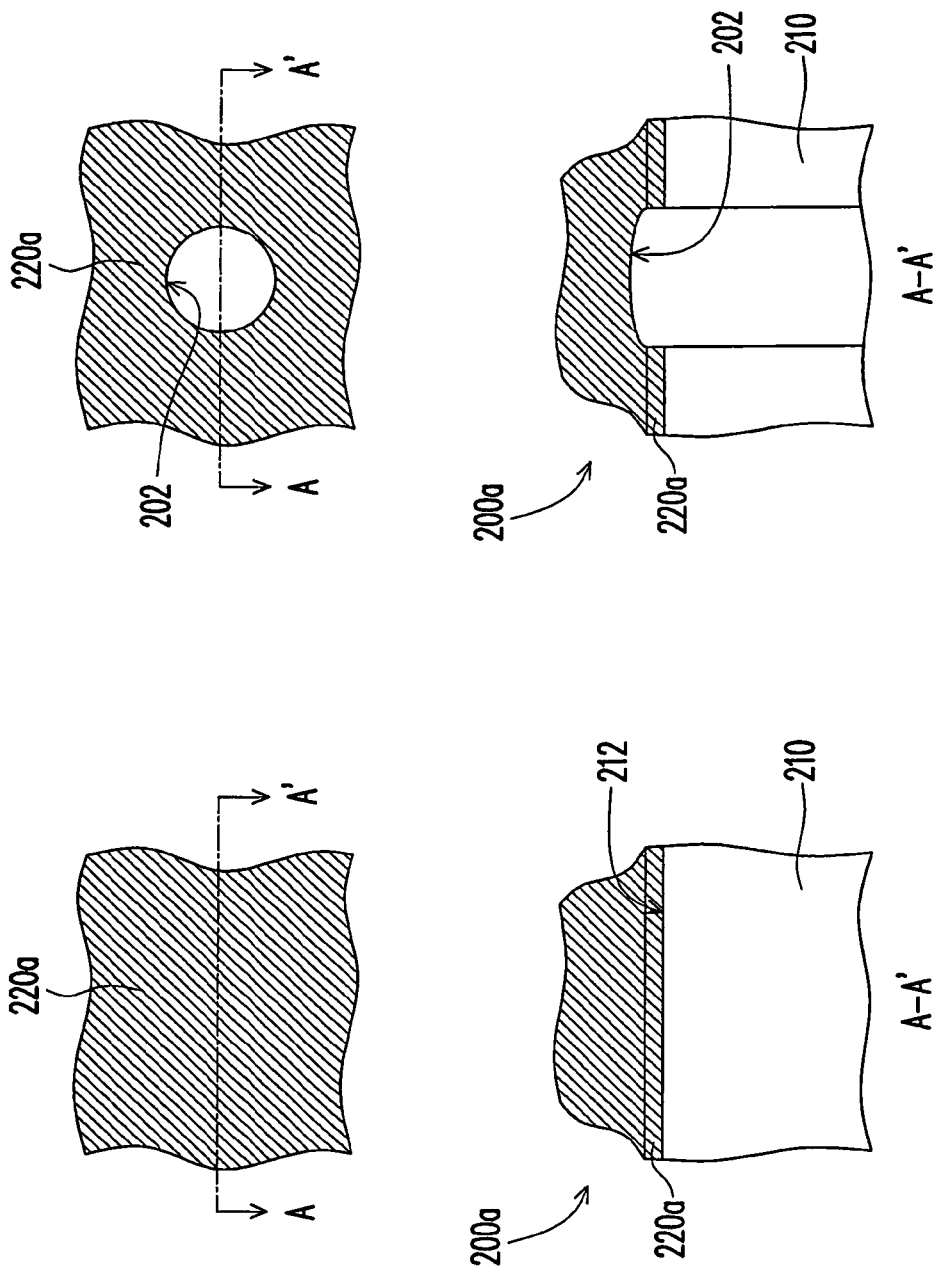

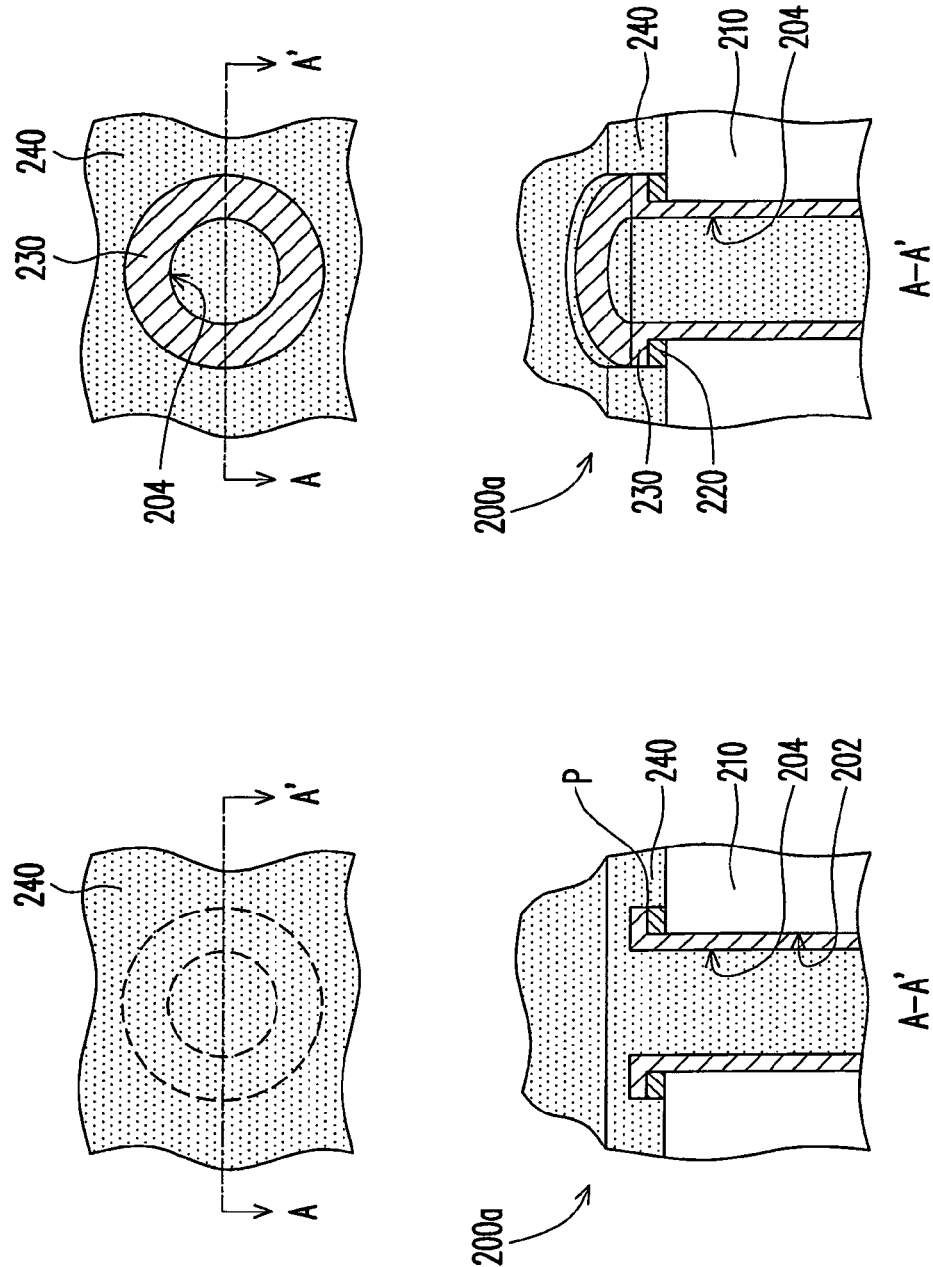

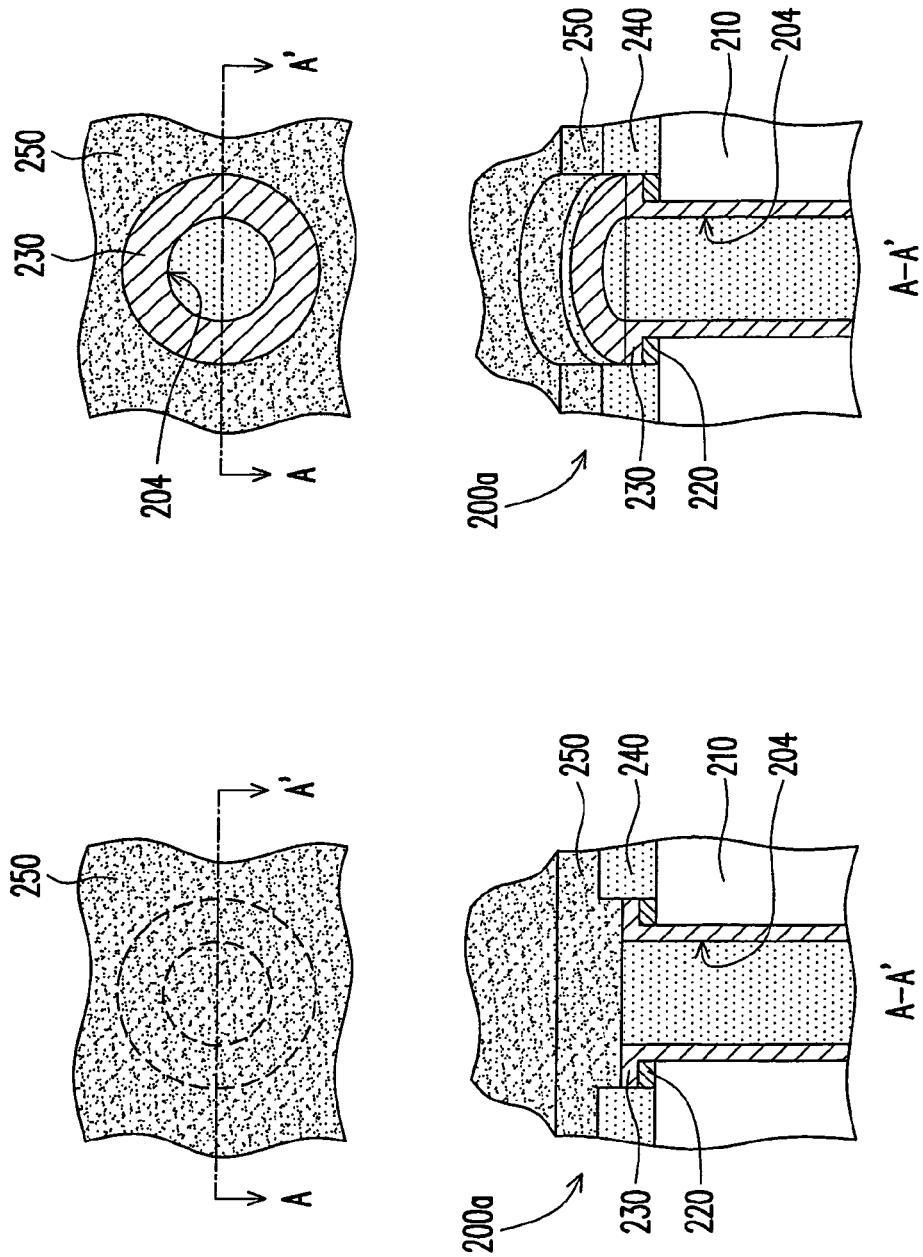

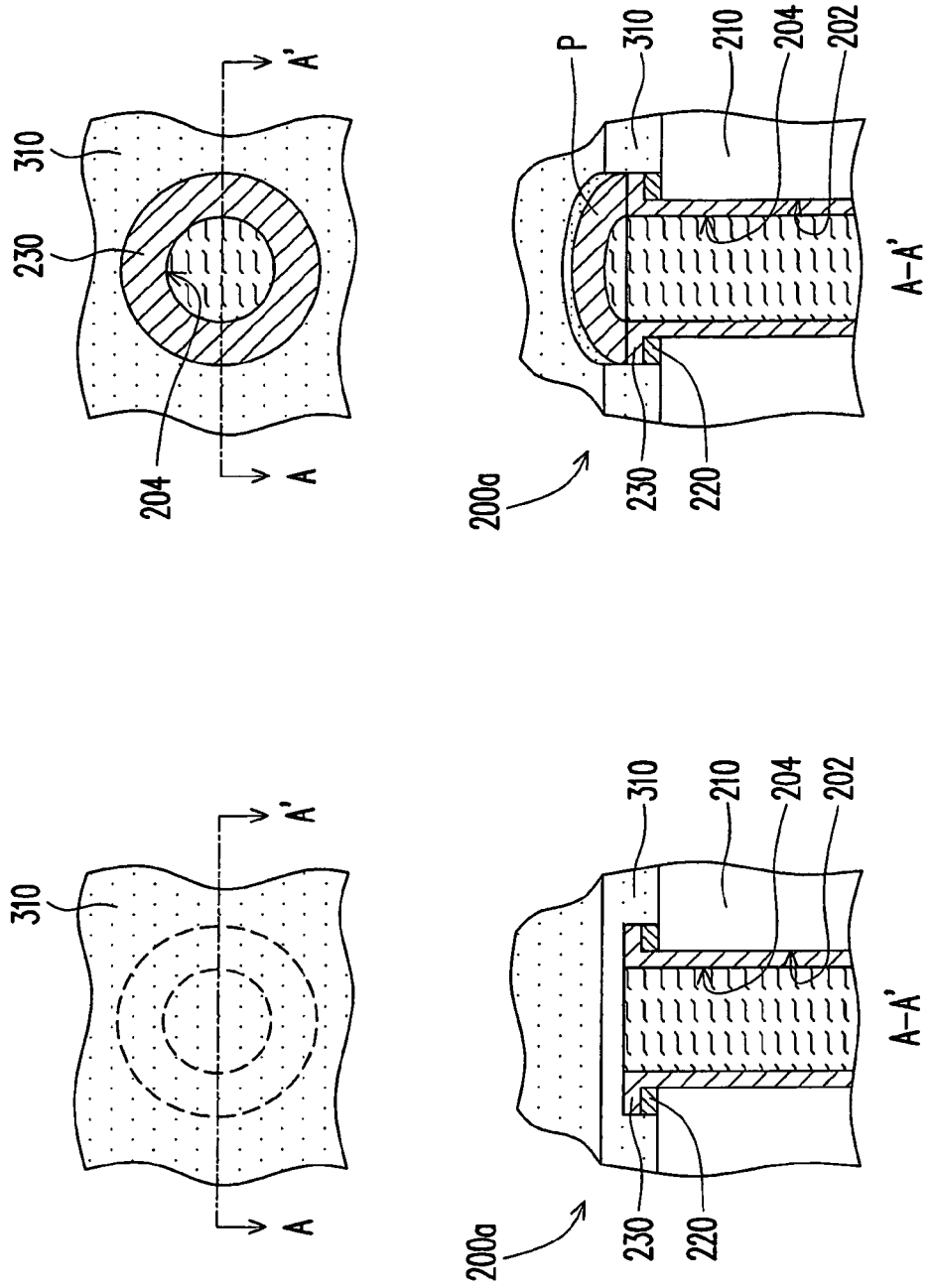

METHOD OF FORMING MEASURING TARGETS FOR MEASURING DIMENSIONS OF SUBSTRATE IN SUBSTRATE MANUFACTURING PROCESS

CROSS-REFERENCE TO RELATED APPLICATION

This application claims the priority benefit of Taiwan application serial no. 97113049, filed on Apr. 10, 2008. The entirety of the above-mentioned patent application is hereby incorporated by reference herein and made a part of this specification.

BACKGROUND OF THE INVENTION

1. Field of the Invention

The present invention generally relates to a method of forming measuring targets for measuring the dimensions of a substrate, in particular, to a method of forming measuring targets for measuring the dimensions of a substrate in a substrate manufacturing process.

2. Description of Related Art

In recent years, the designs of both electronic products and the substrates adopted therein are going towards lightness, slimness, shortness, smallness, multifunctionality, and especially, high circuit density. In an existing method for fabricating a substrate of high circuit density, a hard base layer is provided as the core and circuit layers are then built up outwards. According to this method, dielectric layers and circuit layers are alternatively formed on the top and the bottom of the hard base layer, and the circuit layers are electrically connected by forming vias in the dielectric layers and plating copper in the vias. Because such a substrate has very high circuit density, the positions of the circuit layers and vias have to be very accurate. However, during the fabricating process of such a substrate, the dimensions of the base layer, the dielectric layers, or a solder resist (SR) layer may be changed by heat or other factors so that the accuracy thereof may be reduced and accordingly the process yield may be affected.

SUMMARY OF THE INVENTION

Accordingly, the present invention is directed to a method for instantly measuring the dimensions of a substrate during a substrate manufacturing process, wherein the accuracy in process alignment is improved and accordingly the process yield is increased.

The present invention provides a method of forming measuring targets for measuring the dimensions of a substrate during a substrate manufacturing process. The method includes: (a) providing a board, wherein the board has a base layer and a first conductive layer, and the first conductive layer is disposed on a surface of the base layer; (b) forming at least one through hole on the board as a measuring target for measuring the dimensions of the substrate; (c) forming a plated via in the through hole as a next measuring target for measuring the dimensions of the substrate; (d) forming a dielectric layer on the board; and (e) removing the dielectric layer above the plated via to expose the plated via as a next measuring target for measuring the dimensions of the substrate.

According to an embodiment of the present invention, the plated via is formed by forming a second conductive layer on the surface of the first conductive layer and the internal sidewall of the through hole and then patterning the first conductive layer and the second conductive layer on the surface of the base layer to form a passivation pad around the through hole, wherein the passivation pad is connected to the second conductive layer on the internal sidewall of the through hole.

According to an embodiment of the present invention, the through hole is formed in the board by performing mechanical drilling or laser drilling to the board.

According to an embodiment of the present invention, the dielectric layer is filled in the through hole in step (d).

According to an embodiment of the present invention, the dielectric layer is formed on the board by pressing a build-up film on the board.

According to an embodiment of the present invention, the build-up film is an Ajinomoto build-up film (ABF).

According to an embodiment of the present invention, the dielectric layer is partially removed by performing mechanical drilling or laser drilling to the dielectric layer.

According to an embodiment of the present invention, the method further includes following steps after step (e): (f) forming a solder resist layer (SR layer) on the board, wherein the SR layer is formed by printing a SR material on the board; and (g) removing the SR layer above the plated via to expose the plated via as a next measuring target for measuring the dimensions of the substrate, wherein the SR layer is partially removed through a photolithography process.

According to an embodiment of the present invention, steps (d) and (e) are repeated at least once before step (f).

The present invention further provides a method of forming measuring targets for measuring the dimensions of a substrate during a substrate manufacturing process. First, a board is provided, wherein the board has a base layer and a first conductive layer, and the first conductive layer is disposed on a surface of the base layer. Then, at least one through hole is formed on the board as a measuring target for measuring the dimensions of the substrate for the first time. Next, a second conductive layer is formed on the surface of the first conductive layer and the internal sidewall of the through hole. After that, the first conductive layer and the second conductive layer on the surface of the base layer are patterned to form a passivation pad around the through hole, and here the through hole is served as a measuring target for measuring the dimensions of the substrate for the second time. Next, a first dielectric layer is formed on the surface of the base layer, and the first dielectric layer is filled in the through hole. Thereafter, the first dielectric layer above the passivation pad and the through hole is removed to form a first opening, wherein the first opening exposes the passivation pad and the through hole as a measuring target for measuring the dimensions of the substrate for the third time. After that, a second dielectric layer is formed on the first dielectric layer, and the second dielectric layer is filled in the first opening. Next, the second dielectric layer above the passivation pad and the through hole is removed to form a second opening, wherein the second opening exposes the passivation pad and the through hole as a measuring target for measuring the dimensions of the substrate for the fourth time. After that, a SR layer is formed on the second dielectric layer, and the SR layer is filled in the second opening. Next, the SR layer above the passivation pad and the through hole is removed to form a third opening, wherein the third opening exposes the passivation pad and the through hole as a measuring target for measuring the dimensions of the substrate for the fifth time.

According to an embodiment of the present invention, the through hole is formed in the board by performing mechanical drilling or laser drilling to the board.

According to an embodiment of the present invention, the first dielectric layer or the second dielectric layer is formed on the board by pressing a build-up film on the board, wherein the build-up film is an ABF.

According to an embodiment of the present invention, the first dielectric layer or the second dielectric layer is partially removed by performing mechanical drilling or laser drilling to the first dielectric layer or the second dielectric layer.

According to an embodiment of the present invention, the SR layer is formed by printing a SR material on the board, and the SR layer is partially removed through a photolithography process.

As described above, in the present invention, measuring targets for measuring the dimensions of a substrate are formed during a substrate manufacturing process so that the dimensions of the substrate can be instantly measured during the fabricating process thereof and accordingly the accuracy in process alignment can be improved. Moreover, according to the present invention, no additional step is to be executed in the original substrate manufacturing process. Thereby, the fabrication cost of the substrate is not increased.

BRIEF DESCRIPTION OF THE DRAWINGS

The accompanying drawings are included to provide a further understanding of the invention, and are incorporated in and constitute a part of this specification. The drawings illustrate embodiments of the invention and, together with the description, serve to explain the principles of the invention.

FIGS. 2A~2J, FIG. 3A, and FIG. 3B are flowcharts illustrating how to form measuring targets for measuring the dimensions of a substrate according to the present invention.

DESCRIPTION OF THE EMBODIMENTS

Figure 1:
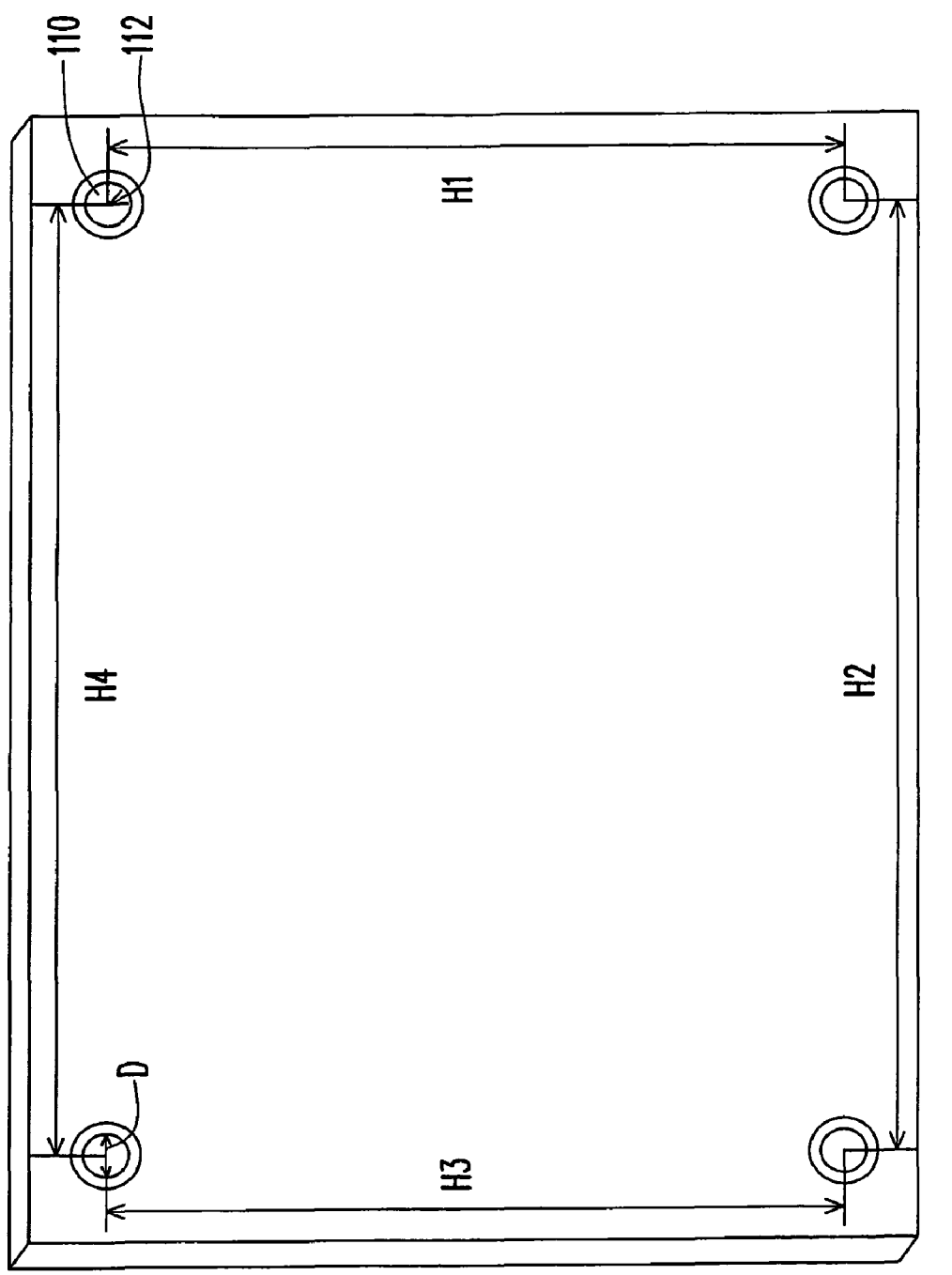
FIG. 1 illustrates a method for measuring the dimensions of a substrate by using measuring targets on the substrate according to an embodiment of the present invention.

Reference will now be made in detail to the present preferred embodiments of the invention, examples of which are illustrated in the accompanying drawings. Wherever possible, the same reference numbers are used in the drawings and the description to refer to the same or like parts.

FIG. 1 illustrates a method for measuring the dimensions of a substrate by using measuring targets on the substrate according to an embodiment of the present invention.

Referring to FIG. 1, in the present embodiment, the substrate 100 has a plurality of measuring targets 110, and the measuring targets 110 can be disposed at any suitable position on the substrate 100. In the present embodiment, the measuring targets 110 may be formed at four corners of the substrate 100, wherein the dimensions of the substrate 100 can be instantly measured by using the measuring targets 110 during the fabricating process of the substrate 100 and accordingly the accuracy in process alignment can be increased. Generally speaking, the method for measuring the dimensions of the substrate in the present invention may include obtaining the dimension changes of the substrate 100 during the process by measuring the distances H1, H2, H3, and H4 between the internal diameters D of the measuring targets 110 and the central points 112 thereof; however, the detailed calculations will not be described herein. Below, the method for forming measuring targets during the fabricating process of a substrate will be further described according to the present invention.

FIGS. 2A~2J, FIG. 3A, and FIG. 3B are flowcharts illustrating how to form measuring targets for measuring the dimensions of a substrate according to the present invention.

First, referring to FIG. 2A, a board 200a having a base layer 210 and a conductive layer 220a is provided. The base layer 210 has a top surface 212 and a bottom surface (not shown) opposite to the top surface 212, and the conductive layer 220a is disposed on the top surface 212 of the base layer 210. Substantially, measuring targets can be formed on both surfaces of the base layer 210; however, for the convenience of description, in the present embodiment, only the process for forming measuring targets on the top surface of the substrate will be described.

Then, referring to FIG. 2B, at least one through hole 202 is formed on the board 200a as a measuring target for measuring the dimensions of the substrate. This step may be executed at the same time as the process for forming plated via used for transmitting signals on the substrate. In other words, while forming the through hole 202, through holes (not shown) for forming plated via used for transmitting signals may also be formed at other positions of the board 200a, so as to connect the conductive layer 220a and a conductive layer (not shown) on the other side of the base layer 210. In the present embodiment, the through hole 202 may be formed by performing mechanical drilling or laser drilling to the board 200a.

Figure 2C:
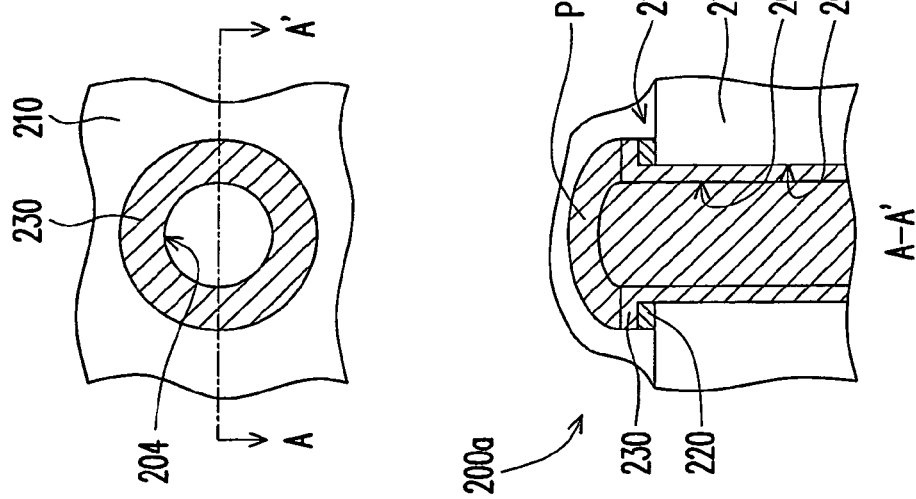
Figure 2D:
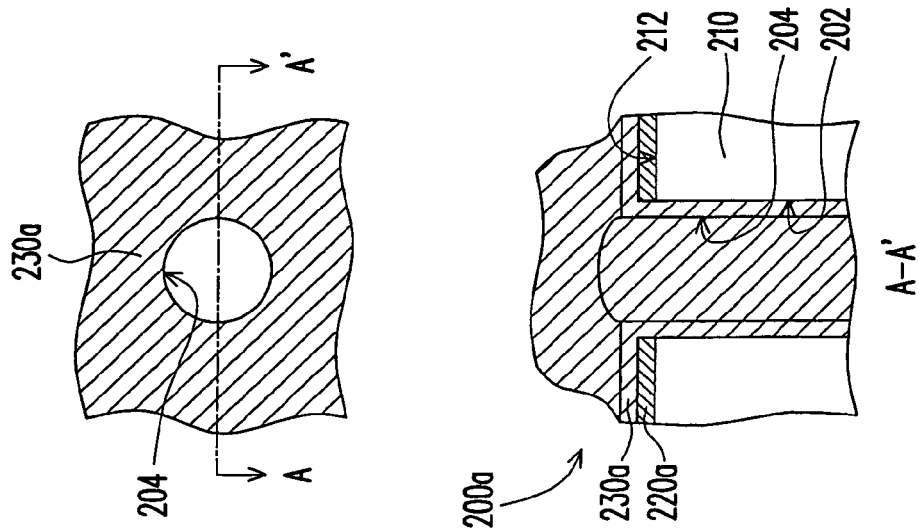
Figure 2J:
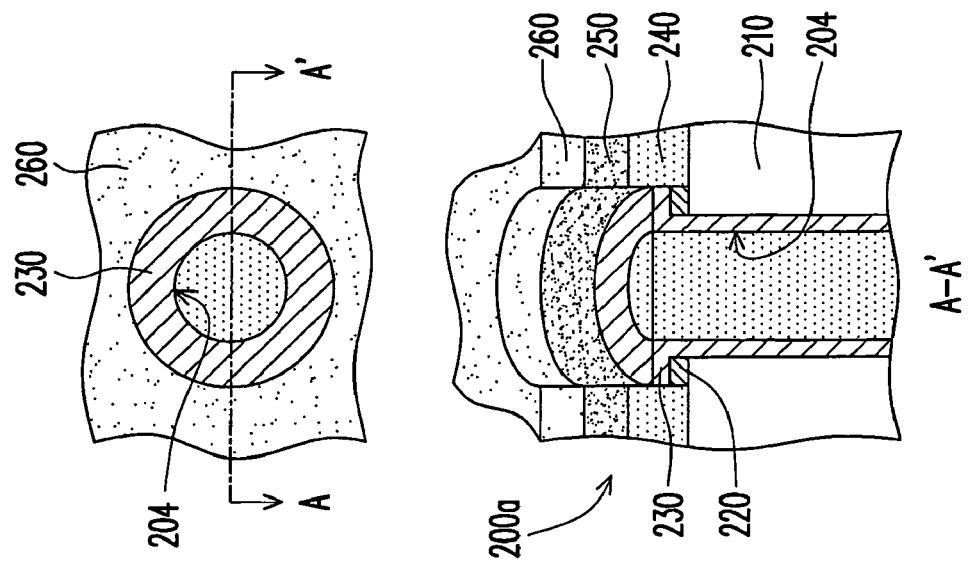
Figure 2I:
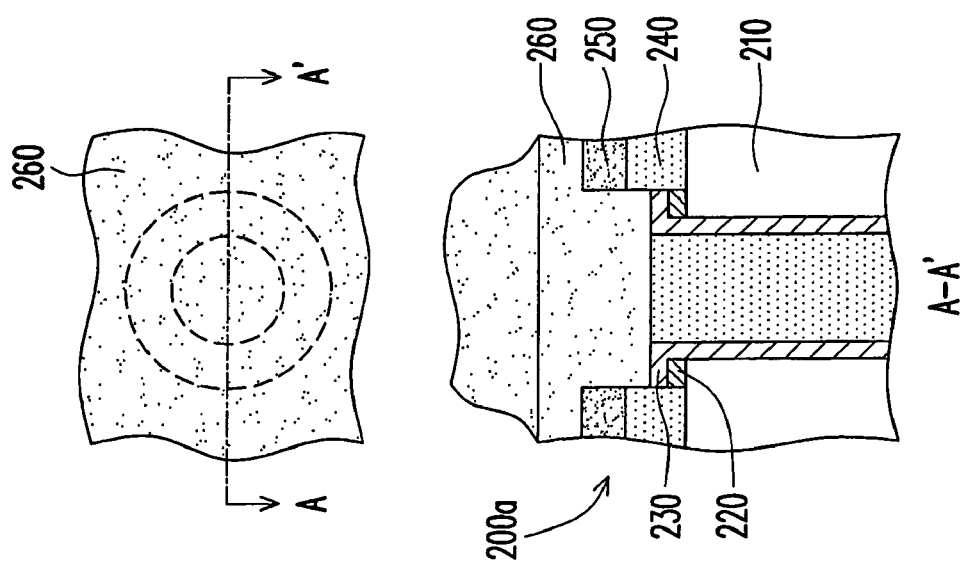

Next, referring to FIG. 2C and FIG. 2D, a patterned conductive layer 220, a patterned conductive layer 230, and a plated via 204 are formed in the through hole 202. At this time, plated vias (not shown) for transmitting signals may also be formed in other through holes of the board 200a so as to connect the circuit layers on both surfaces of the base layer 210, such as the patterned conductive layers 220 and 230 located on the top surface 212 of the base layer 210 and other conductive layers located on the bottom surface of the base layer 210. Compared to other plated vias, the plated via 204 is mainly served as another measuring target for measuring the dimensions of the substrate such that possible deformation of the board 200a in the steps illustrated in FIG. 2C and FIG. 2D can be monitored.

To be specific, referring to FIG. 2C first, a conductive layer 230a is formed on the surface of the conductive layer 220a, the internal sidewall of the through hole 202 and the internal sidewalls of other through holes. Then referring to FIG. 2D, the conductive layer 220a and the conductive layer 230a on the top surface 212 of the base layer 210 are patterned to form the patterned conductive layer 220 and the patterned conductive layer 230 and a passivation pad P around the through hole 202. The passivation pad P is formed by part of the patterned conductive layer 220 and part of the patterned conductive layer 230 and is connected to the patterned conductive layer 230 on the internal sidewall of the through hole 202. The conductive layer 220a and the conductive layer 230a on the top surface 212 of the base layer 210 may be patterned through a photolithography process.

Through foregoing steps, a circuit layer (i.e. the patterned conductive layer) is respectively formed on the top surface and the bottom surface of the base layer 210. At this time, the through holes may be filled up, and a solder resist (SR) layer is respectively formed on the top surface and the bottom surface of the board 200a so as to form a double-layer circuit substrate structure. Or, a plurality of dielectric layers and circuit layers may be further built up on the top surface and the bottom surface of the board 200a so as to obtain a circuit substrate structure having more layers. The method provided by the present invention for forming measuring targets in foregoing two cases will be described below.

The steps for filling up through holes and fabricating the SR layers so as to form a double-layer circuit substrate are illustrated in FIG. 3A and FIG. 3B. First, referring to FIG. 3A, an insulating material is filled in the through hole 202 and the other through holes so as to prevent the popcorn effect which is caused when vapor enters the through hole 202 and the other through holes, wherein the insulating material may be printed in the through hole 202 and the other through holes, and the insulating material may be hole-filling ink. After that, a SR layer 310 is formed on the board 200a, wherein the SR layer 310 may be formed by printing a SR material on the board 200a, and the SR material may be photosensitive. Next, as shown in FIG. 3B, the SR layer 310 above the plated via 204 is removed to expose the plated via 204 as another measuring target for measuring the dimensions of the substrate, and at the same time, at least one opening (not shown) is formed on the SR layer 310 to expose part of the patterned conductive layer 230 as a contact for electrically connecting the substrate and an external circuit board (not shown). If the SR material is photosensitive, then part of the SR layer 310 may be removed through a photolithography process.

The method for forming measuring targets in a substrate having more layers of circuits is illustrated in following steps. Referring to FIG. 2E, a dielectric layer 240 is formed on the board 200a, and the dielectric layer 240 may be filled in the through hole 202. The dielectric layer 240 may be formed on the board 200a by pressing a build-up film on the board 200a, wherein the build-up film may be an Ajinomoto build-up film (ABF).

Then, referring to FIG. 2F, the dielectric layer 240 above the plated via 204 is removed to expose the plated via 204 as another measuring target for measuring the dimensions of the substrate, and at the same time, at least one opening (not shown) is formed in the dielectric layer 240 to expose part of the patterned conductive layer 230. Along with the fabrication of other circuit layers, a patterned conductive layer (not shown) may be further formed on the dielectric layer 240, and the patterned conductive layer is connected to the patterned conductive layer below the dielectric layer 240 through the opening of the dielectric layer 240. The part of the dielectric layer 240 may be removed by performing mechanical drilling or laser drilling to the dielectric layer 240.

Thereafter, referring to FIG. 2G, a dielectric layer 250 is formed on the board 200a. After that, referring to FIG. 2H, the dielectric layer 250 above the plated via 204 is removed to expose the plated via 204 as another measuring target for measuring the dimensions of the substrate, and at the same time, at least one opening (not shown) is formed in the dielectric layer 250 to expose part of the patterned conductive layer on the dielectric layer 240. Then, a patterned conductive layer (not shown) is formed on the dielectric layer 250, and the patterned conductive layer is connected to the patterned conductive layer below the dielectric layer 250 through the opening of the dielectric layer 250.

Through foregoing steps, three circuit layers are respectively formed on the top surface and the bottom surface of the base layer 210 so that a six-layer circuit substrate structure is formed. After that, referring to FIG. 2I, a SR layer 260 is formed on the board 200a. Then referring to FIG. 2J, the SR layer 260 above the plated via 204 is removed to expose the plated via 204 as another measuring target for measuring the dimensions of the substrate, and at the same time, the SR layer 260 is also patterned to expose part of the patterned conductive layer on the dielectric layer 250 as a contact for electrically connecting the substrate and an external circuit board (not shown). By now, a circuit substrate structure having six-layer of circuits is fabricated.

As described above, the method for forming measuring targets during a substrate manufacturing process is respectively described with a double-layer substrate and a six-layer substrate as an example in embodiments of the present invention; however, the present invention may also be applied to the formation of measuring targets in a four-layer substrate or a substrate having more layers. For example, measuring targets can be formed in a four-layer substrate by just reducing the steps illustrated in FIG. 2G and FIG. 2H, and measuring targets can be formed in a substrate having more layers by just repeating the steps illustrated in FIG. 2G and FIG. 2H at least once before the steps illustrated in FIG. 2I.

In overview, according to the present invention, the formation of measuring targets can be integrated into an original substrate manufacturing process so that no additional step is required and accordingly the fabrication cost is not increased. Besides, the dimensions of the substrate can be instantly measured so that the accuracy of process alignment can be improved. Moreover, in the present invention, through holes and plated vias in the through holes formed in the substrate are served as the measuring targets for measuring the dimensions of the substrate. Thus, the measurements are not affected by the deformation of dielectric layers or SR layers, and accordingly the accuracy in process alignment is further improved and the production yield is increased.

It will be apparent to those skilled in the art that various modifications and variations can be made to the structure of the present invention without departing from the scope or spirit of the invention. In view of the foregoing, it is intended that the present invention cover modifications and variations of this invention provided they fall within the scope of the following claims and their equivalents.

What is claimed is:

1. A method of forming measuring targets for measuring the dimensions of a substrate during a substrate manufacturing process, comprising:
   (a) providing a board, wherein the board comprises a base layer and a first conductive layer, and the first conductive layer is disposed on a surface of the base layer;
   (b) forming at least one through hole on the board as a measuring target for measuring the dimensions of the substrate;
   (c) forming a plated via in the through hole as another measuring target for measuring the dimensions of the substrate;
   (d) forming a dielectric layer on the board and directly on the plated via, wherein the dielectric layer is filled into the through hole to completely fill up the through hole; and
   (e) removing the dielectric layer above the plated via to expose the plated via as a next measuring target for measuring the dimensions of the substrate.

2. The method according to claim 1, wherein the method for forming the plated via comprises:
   forming a second conductive layer on the surface of the first conductive layer and the internal sidewall of the through hole; and
   patterning the first conductive layer and the second conductive layer on the surface of the base layer to form a passivation pad around the through hole, wherein the passivation pad is connected to the second conductive layer on the internal sidewall of the through hole.

3. The method according to claim 1, wherein the method for forming the through hole in the board comprises performing mechanical drilling or laser drilling to the board.

4. The method according to claim 1, wherein the method for forming the dielectric layer on the board comprises pressing a build-up film on the board.

5. The method according to claim 4, wherein the build-up film is an Ajinomoto build-up film (ABF).

6. The method according to claim 1, wherein the method for removing part of the dielectric layer comprises performing mechanical drilling or laser drilling to the dielectric layer.

7. The method according to claim 1, wherein after step (e), the method further comprises:
(f) forming a solder resist (SR) layer on the board; and
(g) removing the SR layer above the plated via to expose the plated via as another measuring target for measuring the dimensions of the substrate.

8. The method according to claim 7, wherein the method for forming the SR layer comprises printing a SR material on the board.

9. The method according to claim 7, wherein the method for removing part of the SR layer comprises performing a photolithography process to the SR layer.

10. The method according to claim 7 further comprising repeating steps (d) and (e) at least once before step (f).

11. A method of forming measuring targets for measuring the dimensions of a substrate during a substrate manufacturing process, comprising:
providing a board, wherein the board comprises a base layer and a first conductive layer, and the first conductive layer is disposed on a surface of the base layer;
forming at least one through hole on the board as a measuring target for measuring the dimensions of the substrate for a first time;
forming a second conductive layer on the surface of the first conductive layer and the internal sidewall of the through hole;
patterning the first conductive layer and the second conductive layer on the surface of the base layer to form a passivation pad around the through hole, wherein the through hole is served as a measuring target for measuring the dimensions of the substrate for a second time;
forming a first dielectric layer on the surface of the base layer, and directly on the passivation pad, wherein the first dielectric layer is filled in the through hole; to completely fill up the through hole;
removing the first dielectric layer above the passivation pad and the through hole to form a first opening, wherein the first opening exposes the passivation pad and the through hole as a measuring target for measuring the dimensions of the substrate for a third time;
forming a second dielectric layer on the first dielectric layer, wherein the second dielectric layer is filled in the first opening;
removing the second dielectric layer above the passivation pad and the through hole to form a second opening, wherein the second opening exposes the passivation pad and the through hole as a measuring target for measuring the dimensions of the substrate for a fourth time;
forming a solder resist(SR) layer on the second dielectric layer, wherein the SR layer is filled in the second opening; and
removing the SR layer above the passivation pad and the through hole to form a third opening, wherein the third opening exposes the passivation pad and the through hole as a measuring target for measuring the dimensions of the substrate for a fifth time.

12. The method according to claim 11, wherein the method for forming the through hole in the board comprises performing mechanical drilling or laser drilling to the board.

13. The method according to claim 11, wherein the method for forming the first dielectric layer or the second dielectric layer on the board comprises pressing a build-up film on the board.

14. The method according to claim 13, wherein the build-up film is an ABF.

15. The method according to claim 11, wherein the method for removing part of the first dielectric layer or part of the second dielectric layer comprises performing mechanical drilling or laser drilling to the first dielectric layer or the second dielectric layer.

16. The method according to claim 11, wherein the method for forming the SR layer comprises printing a SR material on the board.

17. The method according to claim 16, wherein the method for removing part of the SR layer comprises performing a photolithography process to the SR layer.

* * * * *